US008576006B1

(12) United States Patent
Davis

(10) Patent No.: US 8,576,006 B1
(45) Date of Patent: Nov. 5, 2013

(54) WIDEBAND VARIABLE GAIN AMPLIFIER

(75) Inventor: Brandon R. Davis, Mount Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 50 days.

(21) Appl. No.: 13/306,674

(22) Filed: Nov. 29, 2011

Related U.S. Application Data

(60) Provisional application No. 61/418,142, filed on Nov. 30, 2010.

(51) Int. Cl.
 *H03F 3/45* (2006.01)
(52) U.S. Cl.
 USPC .......................................................... 330/254
(58) Field of Classification Search
 USPC ........................................... 327/359; 330/254
 See application file for complete search history.

(56) References Cited

U.S. PATENT DOCUMENTS

| | | | |
|---|---|---|---|
| 6,388,502 B2 * | 5/2002 | Kaneki et al. | 327/359 |
| 6,426,680 B1 | 7/2002 | Duncan et al. | |
| 6,761,069 B2 | 7/2004 | Hollocher et al. | |
| 6,927,714 B1 | 8/2005 | Teterwak | |
| 6,972,625 B2 | 12/2005 | Nguyen et al. | |
| 7,482,879 B2 * | 1/2009 | Koutani et al. | 330/311 |
| 7,696,823 B2 | 4/2010 | Khorramabadi | |
| 7,848,724 B2 | 12/2010 | Bult et al. | |
| 7,868,665 B2 | 1/2011 | Tumer et al. | |
| 7,936,210 B2 | 5/2011 | Robinson et al. | |
| 7,960,997 B2 | 6/2011 | Williams | |
| 2002/0171489 A1 | 11/2002 | Ritchie | |

* cited by examiner

*Primary Examiner* — Steven J Mottola
(74) *Attorney, Agent, or Firm* — Howard IP Law Group, PC

(57) ABSTRACT

A variable gain amplifier includes a first transistor having a base for receiving a radio frequency ("RF") input signal. A first differential transistor pair is coupled in parallel to a second transistor. The first differential transistor pair and the second transistor are coupled to a collector of the first transistor and to an output node of the first variable gain amplifier. Each transistor of the first differential transistor pair is configured to receive a control signal at its respective gate for adjusting a gain of the variable gain amplifier.

16 Claims, 11 Drawing Sheets

WIDEBAND VARIABLE GAIN AMPLIFIER

CROSS-REFERENCE TO RELATED APPLICATIONS

This application claims priority under 35 U.S.C. Section 119(e) to U.S. Patent Application Ser. No. 61/418,142 filed on Nov. 30, 2010, the entirety of which is herein incorporated by reference.

FIELD OF DISCLOSURE

The disclosed circuit and method relate to integrated circuits. More specifically, the disclosed circuit and method relate to variable gain amplifiers that may be implemented as an integrated circuit.

BACKGROUND

Wireless communications receivers may receive signals that experience wide variations in signal power. The power of the demodulating signal is controlled such that the signal may be properly processed. For example, wireless receivers typically implement a variable gain amplifier ("VGA") that adjust the gain of the received signal based on the power of the received signal.

However, these conventional VGAs typically suffer from having undesired phase changes based on the gain setting of the VGA. However this proposed solution leads to a complex design and is difficult to correctly calibrate. One conventional solution to reducing the phase change of a VGA is to control the gate voltage of the current steering transistor. However, controlling the gate voltage of the current steering transistor also requires a digital-to-analog converter ("DAC") for controlling the bias voltage as well as difficult calibration techniques, which also leads to a complex design that is difficult to calibrate and still suffers from significant phase change.

SUMMARY

A variable gain amplifier is disclosed that includes a first transistor having a base for receiving a radio frequency ("RF") input signal. A first differential transistor pair is coupled in parallel to a second transistor. The first differential transistor pair and the second transistor are coupled to a collector of the first transistor and to an output node of the variable gain amplifier. Each transistor of the first differential transistor pair is configured to receive a control signal at its respective gate for adjusting a gain of the variable gain amplifier.

Also disclosed is a method of adjusting a gain of a variable gain amplifier. The method includes receiving a first radio frequency (RF) signal at a base of a first transistor having a collector coupled to a first differential transistor pair and to a second transistor coupled in parallel with the first differential transistor pair, receiving a control signal at a gate of each of the transistors of the first differential transistor pair to adjust the gain of the variable gain amplifier, and outputting a second RF signal from a node coupled to at least one of the transistors of the first differential transistor pair.

A variable gain amplifier is also disclosed that includes a first transistor having a base configured to receive a first radio frequency (RF) signal and a collector coupled to first and second differential transistor pairs coupled to an output node of the variable gain amplifier and in parallel with each other. Each transistor of the first and second differential transistor pairs is configured to receive a respective control signal for adjusting a gain of the variable gain amplifier.

DETAILED DESCRIPTION

Improved current-steering VGAs are disclosed in which current is steered to or from the load by FET cascodes that are switched off and on in adjustable combinations as described later. The current density in the active devices in the VGA stays constant thereby mitigating the phase changes and non-linearities over different gain states that degrade the performance of conventional VGA designs. The FETs are sized to control the gain steps and can be laid out side-by-side such that they have a compact footprint. In one example, the devices have the same finger width and length but a varying number of fingers such that the cascode FET is laid out as a single device with individually controllable fingers. Controlling the gain in this way advantageously enables a compact implementation as well as a wideband method of gain control.

The relative size of each gain step can be adjusted by sizing the cascoded FETs in relation to one another in order to adjust the ratio of current steered to either the load or to the power rail. The gain step size may be selected without the need for an accompanying digital-to-analog converter ("DAC"). Additionally, the gain step size is tolerant to variations in processing since the gain steps are set by the size of the devices in relation to one another. Put another way, the devices tend to vary in size as a whole yet their sizes in relation to one another tend to experience less variation in modern foundries and therefore the gain step size has less variation using this topology.

Figure 1:
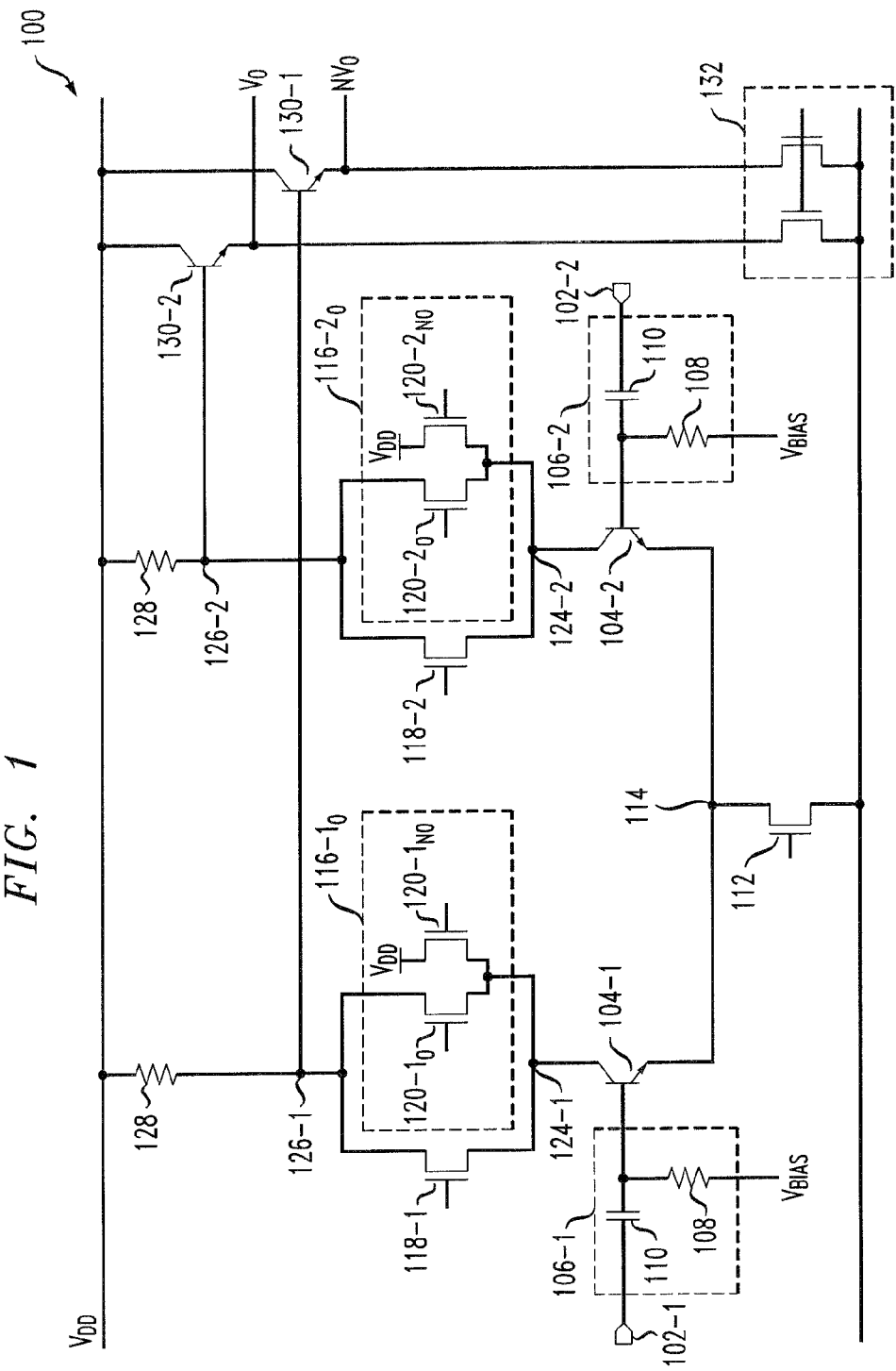
FIG. 1 illustrates one example of a wideband variable gain amplifier having single bit gain control.

FIG. 1 illustrates one example of a wideband variable gain amplifier ("VGA") 100. VGA 100 may be digitally controlled to steer current to the load or to the supply rail, which enables the gain to be adjusted with minimal phase change between gain settings over a wide bandwidth. Additionally, wideband VGA 100 may be implemented in a compact area.

As shown in FIG. 1, VGA 100 includes a pair of differential input nodes 102-1, 102-2 configured to receive a differential radio frequency ("RF") input signal. Each input node 102-1, 102-2 (collectively referred to as "input nodes 102" or "differential input nodes 102") is coupled to a base of a respective bipolar junction transistor ("BJT") 104-1, 104-2 (collectively referred to as "BJTs 104" or "input transistors 104") through a respective RC network 106-1, 106-2 comprising a capacitor 110 and resistor 108 to form a high-pass filter to block any direct current ("DC") bias voltage as will be understood by one skilled in the art. In some embodiments, other circuit elements may be implemented to block the DC bias. Although input transistors 104 are illustrated as BJTs, one skilled in the art will understand that input transistors 104 may be implemented as metal oxide semiconductor field effect transistors ("MOSFETs" or "FETs").

The emitters of input transistors 104 are coupled to ground through MOS transistor 112, which has its source coupled to ground and its drains coupled to node 114 disposed between the emitters of input transistors 104. The collectors of input transistors 104 are coupled to a pair of differential MOSFET pairs 116-1$_0$, 116-2$_0$ (collectively referred to as "differential MOSFET pairs 116") coupled in parallel with a respective MOS transistor 118-1, 118-2. Each differential MOSFET pair 116 includes a pair of MOSFETs having their respective sources coupled together and their respective gates coupled to respective control nodes 120$_0$, 120$_{N0}$, where node 120$_{N0}$ receives the inverse signal of the signals received at control node 120$_0$. The drain of one MOSFET is coupled to supply voltage V$_{DD}$ or other bias voltage as will be understood by one skilled in the art. The drain of the other MOSFET voltage is coupled to node 126 as described below. Control circuitry (not shown) may be used to control the status (i.e., opening and closing) of differential MOSFET pairs 116 based on a bit of a control word. In the example illustrated in FIG. 1, a one-bit control word may be used to control the status of differential MOSFET pairs 116 and the gain of VGA 100 through current steering as described below.

MOS transistors 118 have their gates coupled to a voltage source node set at a voltage such that MOS transistors 118 are always in a current-conducting "on" state, their respective sources coupled to respective node 124-1, 124-2, which is coupled to the respective collector of input transistors 104, and their respective drains coupled to node 126-1, 126-2, which may be coupled to an operating voltage source rail set at V$_{DD}$ through a resistor 128. In one embodiment, MOS transistors 118 are implemented having the same size (i.e., length and width of the channel and/or gate) as each other and the transistors of at least one of the differential MOSFET pairs 116. In some embodiments, differential MOSFET pairs 106 may have a size that is different than (i.e., a multiple of) the size of MOS transistors 118.

Nodes 126-1 and 126-2 are respectively coupled to the base of output transistors 130-1 and 130-2 (collectively referred to as "output transistors 130"), which have collectors coupled to voltage rail V$_{DD}$ and emitters respectively coupled to output nodes V$_O$ and NV$_O$. The emitters of output transistors 130 may be coupled to a biasing network, such as biasing network 132 including a pair of transistors, as will be understood by one skilled in the art.

Figure 2A:
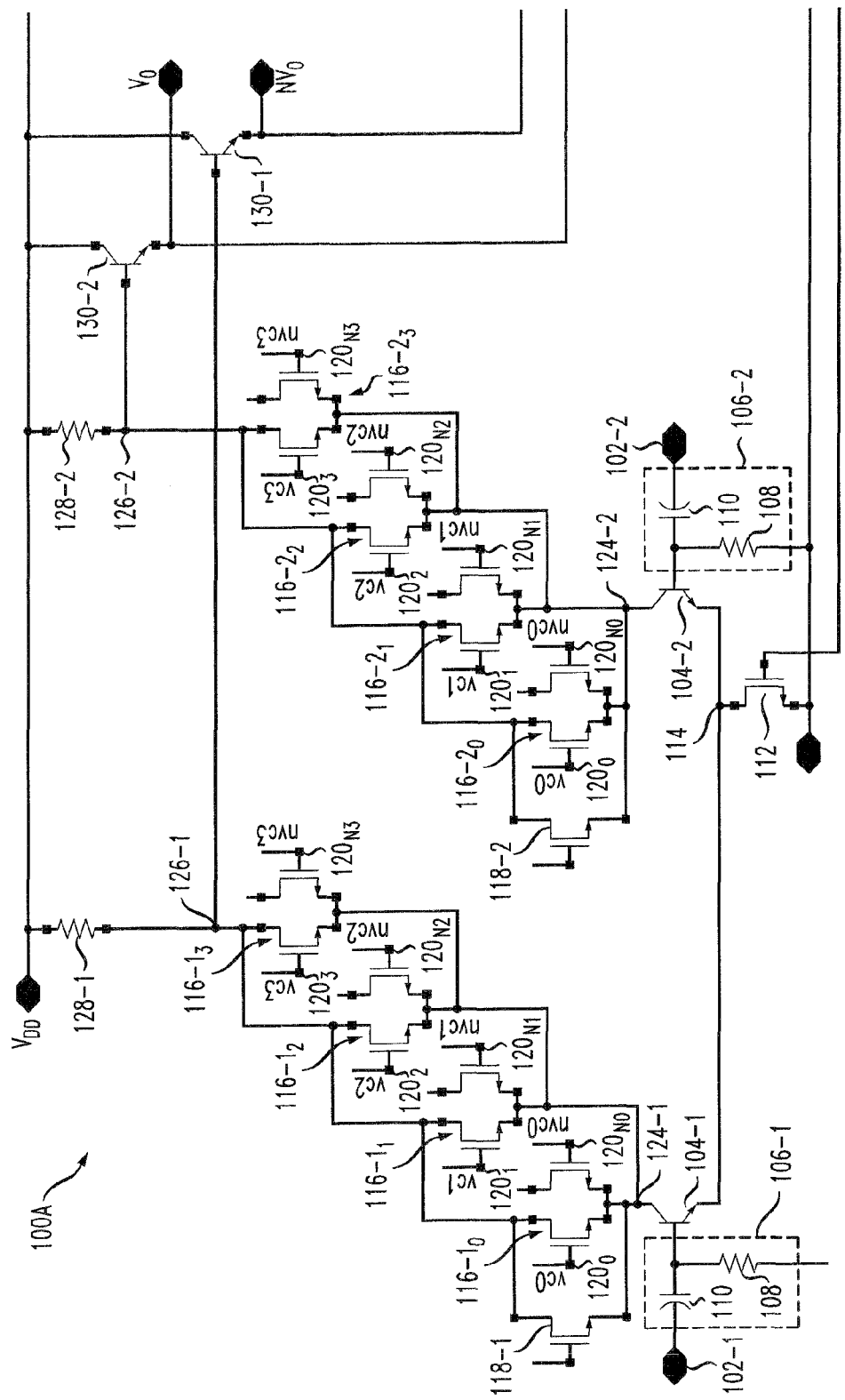
FIG. 2A illustrates one example of a wideband variable gain amplifier having multiple bit control.
Figure 2A:
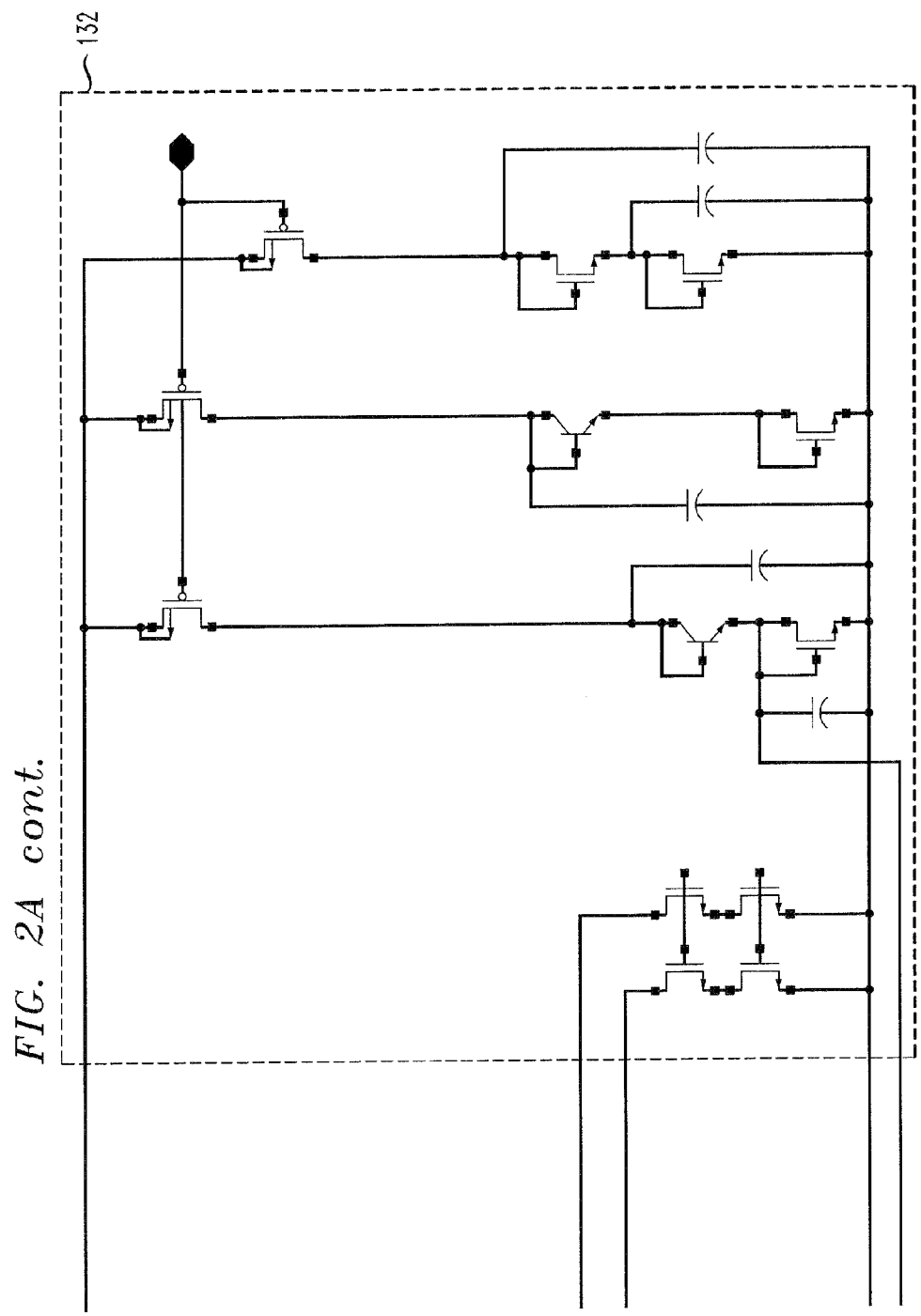

FIG. 2A illustrates an example of a VGA 100A that is controlled by a multiple bit control word. The elements of VGA 100A that are like elements in VGA 100 have the same reference numerals and a detailed description is not repeated. As shown in FIG. 2A, VGA 100A each input transistor 104 is coupled to a respective MOS transistor 118-1, 118-2, which is coupled to four differential MOSFET pairs 116-1$_0$, 116-1$_1$, 116-1$_2$, 116-1$_3$, 116-2$_0$, 116-2$_1$, 116-2$_2$, 116-2$_3$, which are disposed in a cascode with each other and parallel to MOS transistors 118. Although four differential MOSFET pairs 116 are illustrated as being coupled to the collectors of input transistors 104, one skilled in the art will understand that fewer or more differential MOSFET pairs 116 may be implemented.

Each differential MOSFET pair 116 includes a pair of MOSFETs having their respective drains and sources coupled together and their respective gates coupled to a respective control node 120$_0$, 120$_1$, 120$_2$, 120$_3$, 120$_{N0}$, 120$_{N1}$, 120$_{N2}$, 120$_{N3}$ (collectively referred to as "control nodes 120") where control nodes 120$_{N0}$, 120$_{N1}$, 120$_{N2}$, 120$_{N3}$, receive the inverse signal received at nodes 120$_0$, 120$_1$, 120$_2$, 120$_3$. Each control node pair, i.e., nodes 120$_0$ and 120$_{N0}$, of a differential MOSFET pair 116 is coupled to a respective control circuit 122$_0$, 122$_1$, 122$_2$, and 122$_3$ (collectively referred to as "control circuits 122") such as the control circuits 122 illustrated in FIG. 2B. As described below, control circuits 122 are configured to output a respective bit (and its inverse) of a digital control word to the gates of differential MOSFET pairs 116 for coupling together one or more differential MOSFET pairs 116 to the collector of input transistor 104 and thereby provide a current steering function.

In one embodiment, MOS transistors 118 are implemented having the same size (i.e., length and width of the channel and/or gate) as each other and the transistors of at least one of the differential MOSFET pairs 116 however, this is not limiting as MOS transistor 118 may be smaller than 116 (e.g. 118-1 is 1 finger, 116-1$_0$ have 4 fingers each, and so on). In some embodiments, each differential MOSFET pair 116 may have a size that is twice the size of another differential MOSFET pair 116. For example, the transistors of differential MOSFET pairs 116-1$_0$ and 116-2$_0$, which may be controlled by the least significant bit of a digital control word (i.e., bit '0'), may have a size that is equal to MOS transistors 118-1 and 118-2. The transistors of differential MOSFET pairs 116-1$_1$ and 116-2$_1$, which may be controlled by the second least significant bit of a digital control word (i.e., bit '1') may have a size that is twice the size of differential MOSFET pairs 116-1$_0$ and 116-2$_0$; the transistors of differential MOSFET pairs 116-1$_2$ and 116-2$_2$, which may be controlled by the third least significant bit of a digital control word (i.e., bit '2') may have a size that is twice the size of differential MOSFET pairs 116-1$_1$ and 116-2$_1$; and so on. However, one skilled in the art will understand that the relative sizes of MOS transistors 118 and the transistors of the differential MOSFET pairs 116 may be varied.

Nodes 126-1 and 126-2 are respectively coupled to the base of output transistors 130-1 and 130-2 (collectively referred to as "output transistors 130"), which have collectors coupled to voltage rail V$_{DD}$ and emitters respectively coupled to output nodes V$_O$ and NV$_O$. The emitters of output transistors 130 are coupled to a biasing network 132 that may include a plurality of BJT and MOSFET transistors and capacitors as illustrated in FIG. 2A. However, one skilled in the art will understand that the biasing network may be modified in order to provide the desired biasing for VGA 100.

Figure 2B:
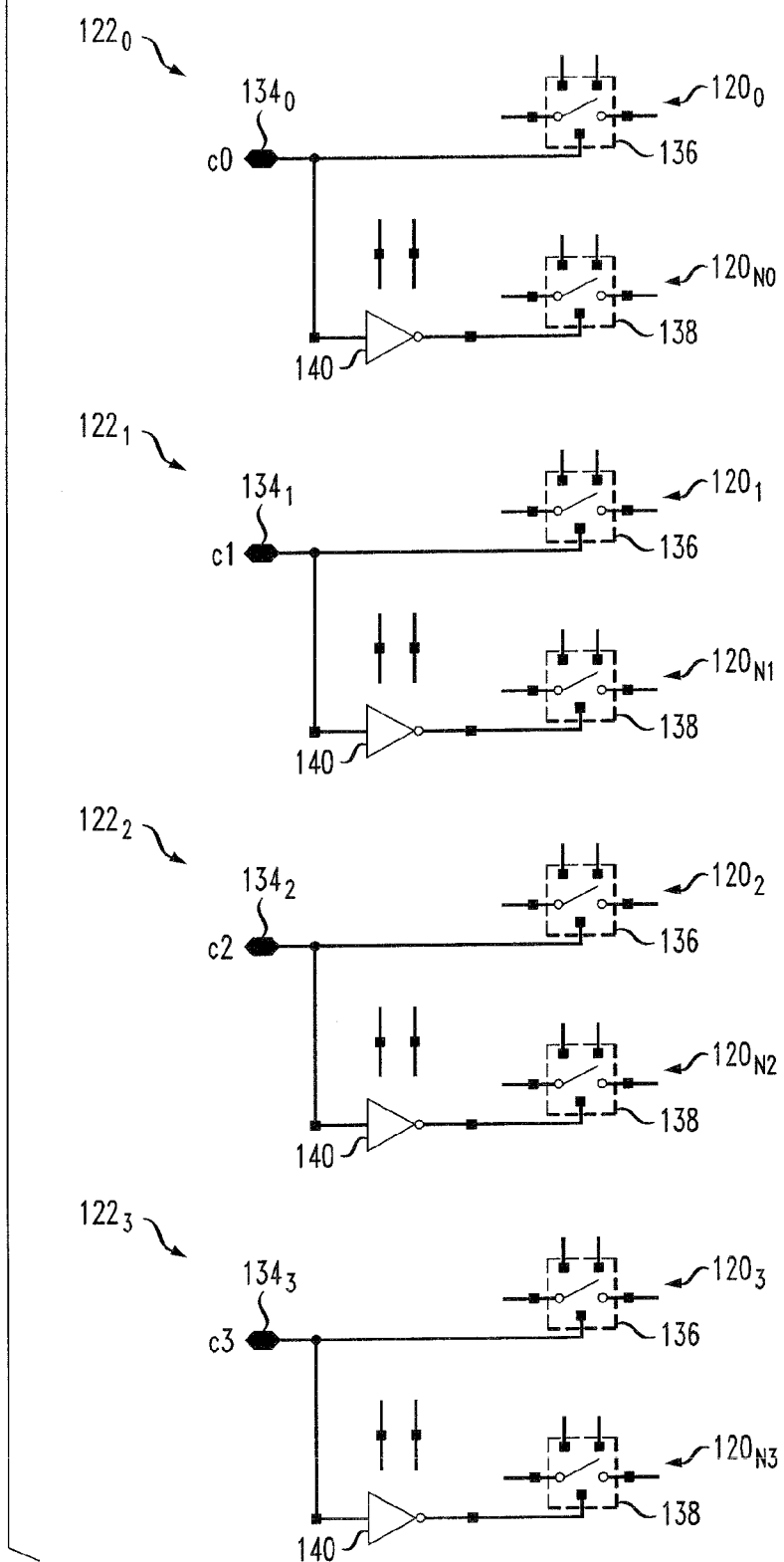
FIG. 2B illustrates one example of control circuitry for controlling the wideband variable gain amplifier illustrated in FIG. 2A.

FIG. 2B illustrates one example of control circuitry 122 for providing control signals to the gates of the differential MOSFET pairs 116 illustrated in FIG. 2A. As shown in FIG. 2B, each control circuit 122 includes a node 134$_0$, 134$_1$, 134$_2$, 134$_3$ for receiving a bit of a control word. For example, node 134$_0$ of control circuit 122$_0$ may be configured to receive the least significant bit of a four bit control word, node 134$_1$ of control circuit 122$_1$ may be configured to receive the second least significant bit of a four bit control word, and so on.

Each control circuit 122 includes a pair of switches 136, 138, with switch 136 being directly coupled to node 134 and switch 138 being coupled to node 134 through an inverter 140. The second end of switch 136 is coupled to one of the control nodes 120 of the differential MOSFET pairs 116 being controlled by the respective bit received at node 134, and the second end of switch 138 is coupled to the other control nodes 120 of the differential MOSFET pairs 116 being controlled by the respective bit received at node 134, i.e., the control node 120 receiving the inverted control bit. For example, switch 136 of control circuit $122_0$ is coupled to nodes $120_0$ of differential MOSFET pairs $116$-$1_0$ and $116$-$2_0$, switch 138 of control circuit $122_0$ is coupled to nodes to nodes $120_{N0}$ of differential MOSFET pairs $116$-$1_0$ and $116$-$2_0$.

The operation of VGA 100A is described with reference to FIGS. 2A and 2B. An RF signal is received at input nodes 102, which are coupled to the base of input transistors 104 of VGA 100A illustrated in FIG. 2A. As shown in FIG. 2B, control circuitry 122 receives a respective bit of a multibit control word, which in this example is a four-bit control word, e.g., '0010'. The least significant bit of the multibit control word, which is '0' (i.e., a low voltage such as $V_{SS}$), is received at node $134_0$ of control circuit $122_0$; the second least significant, which is '1' (i.e., a high voltage such as $V_{DD}$), is received at node $134_1$; the second most significant bit, which is '0', is received at node $134_2$; and the most significant bit, which is '0', is received at node $134_3$. Circuits $122_0$, $122_2$, and $122_3$ respectively output a logic 0 to nodes $120_0$, $120_2$, and $120_3$ through switches 136 and logic 1 to nodes $120_{N0}$, $120_{N2}$, and $120_{N3}$ through inverters 140 and switches 138. Similarly, circuit $122_1$ outputs a logic 1 to node $120_1$ through switch 136 and a logic 0 to node $120_{N1}$.

Turning again to FIG. 2A, differential MOSFET pairs $116$-$1_0$ and $116$-$2_0$ receive the logic signals from control circuit $122_0$ at the gates of the differential MOSFETs. With a logic zero received at node $120_0$, the MOSFET is turned in an off state in which current does not flow through the MOSFET. The drain of the other MOSFET may be connected to the supply voltage $V_{DD}$ or other voltage such that the MOSFET is always in an on state. The same holds true for differential pairs $116$-$1_2$, $116$-$2_2$, and $116$-$1_3$, $116$-$2_3$. Consequently, current from nodes 126-1 and 126-2 does not flow through differential MOSFET pairs $116$-$1_0$, $116$-$2_0$, $116$-$1_2$, $116$-$2_2$, and $116$-$1_3$, $116$-$2_3$ to the collector of input transistors 104. However, the logic one received at the gate of the MOSFETs coupled to node $120_1$ turns these MOSFETs into an on state in which current flows in parallel with the current through MOS transistors 118 from nodes 126 to the collector of input transistors 104 thereby increasing the gain of VGA 100A.

As will be understood by one skilled in the art, each finger (differential MOSFET pair 116) may be individually controlled by changing a bit of the controlled word received by control circuitry 122. For example, changing the second most significant bit of the control word from a logic zero to a logic one would turn on the differential MOSFET pairs $116$-$1_2$ and $116$-$2_2$ resulting in current flowing from nodes 126 to the collector of input transistors 104 and an increase in the gain of VGA 100A.

Figure 2C:
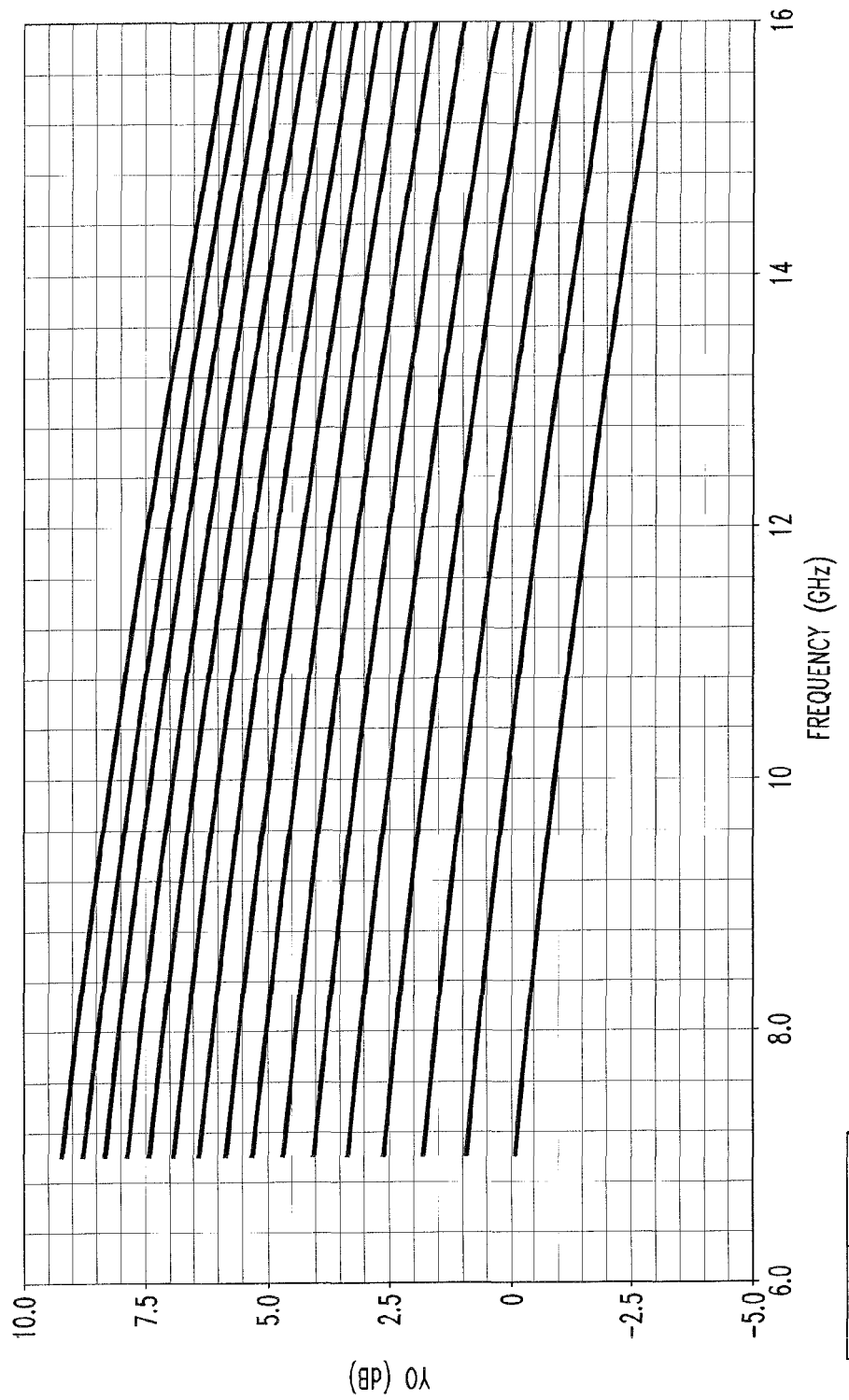
FIG. 2C is a gain versus frequency graph of a simulation of a VGA in accordance with the VGA 100A illustrated in FIGS. 2A and 2B.
Figure 2D:
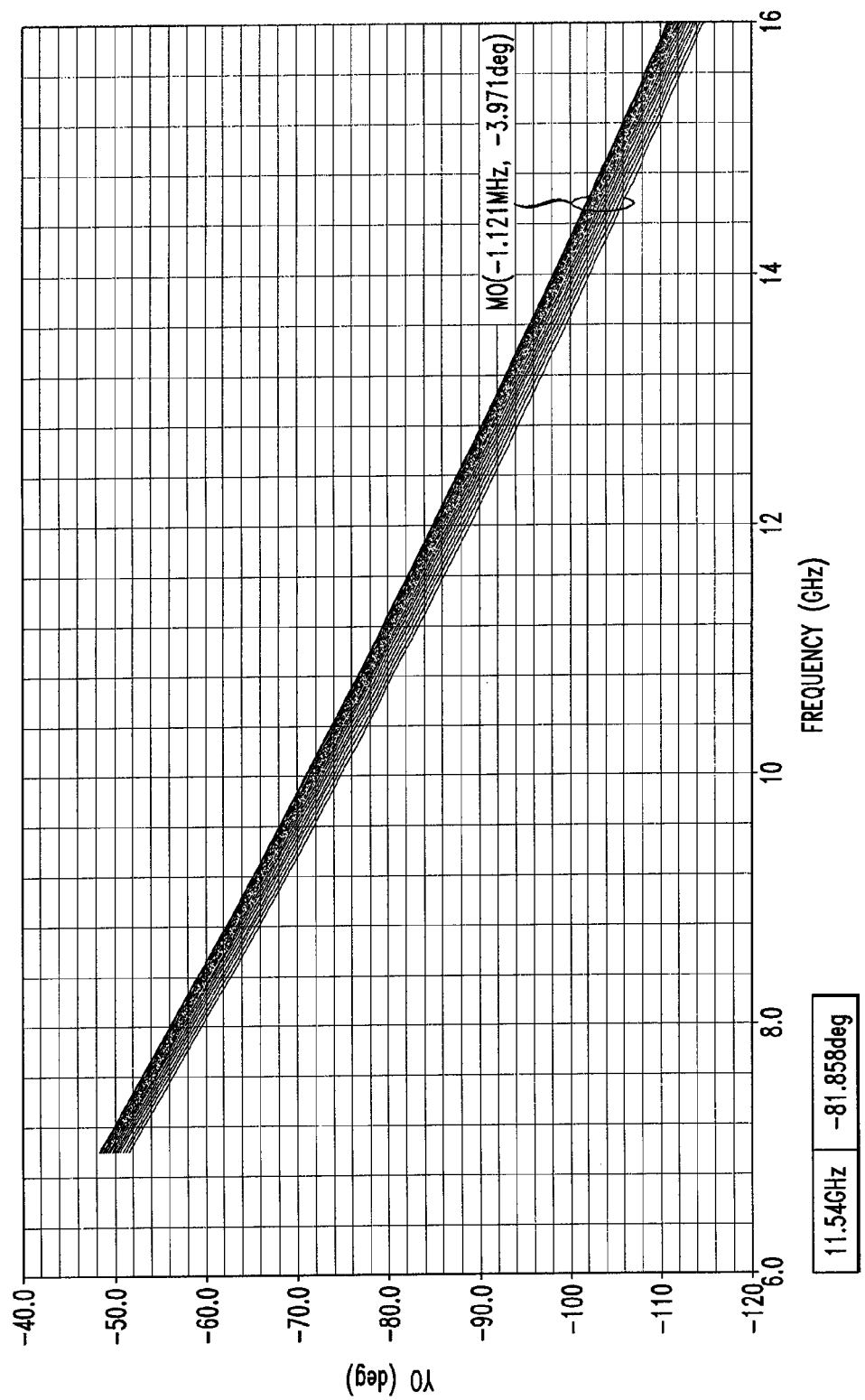
FIG. 2D is a phase variation over gain versus frequency graph of a simulation of the VGA used in to generate the simulation results shown in FIG. 2C.

FIG. 2C is a gain versus frequency graph of a simulation of a VGA in accordance with VGA 100A illustrated in FIGS. 2A and 2B. As shown in FIG. 2C, the four-bit VGA 100A provides sixteen incremental gain increases between approximately 0 dB and approximately 10 dB. FIG. 2D is a phase variation over gain versus frequency graph of a simulation of the VGA used to generate the simulation results shown in FIG. 2C. As shown in FIG. 2D, the VGA advantageously provides variable gain with little phase variation between each of the gain stages.

Figure 3A:
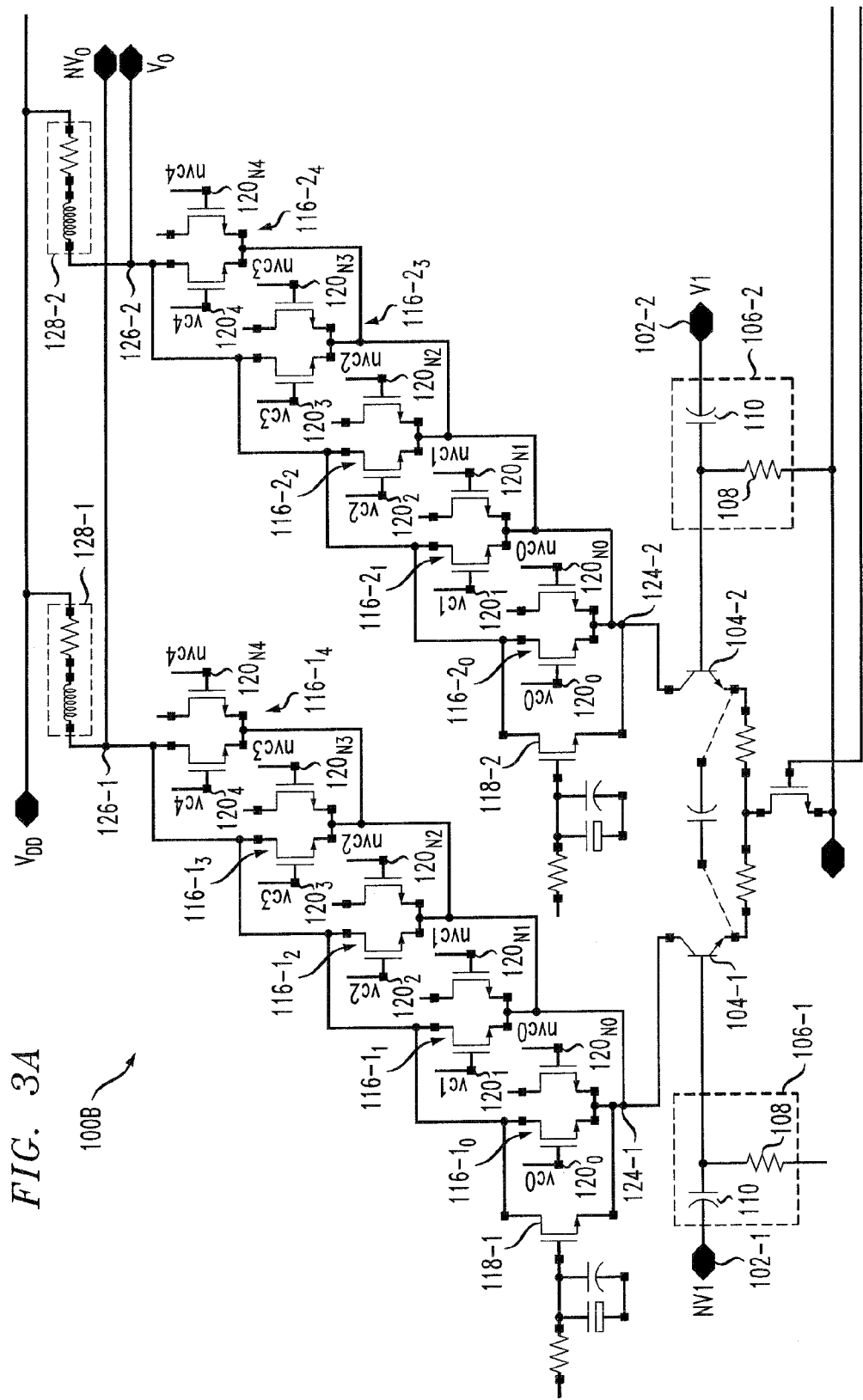
FIG. 3A illustrates another example of a wideband variable gain amplifier having multiple bit control.
Figure 3A:
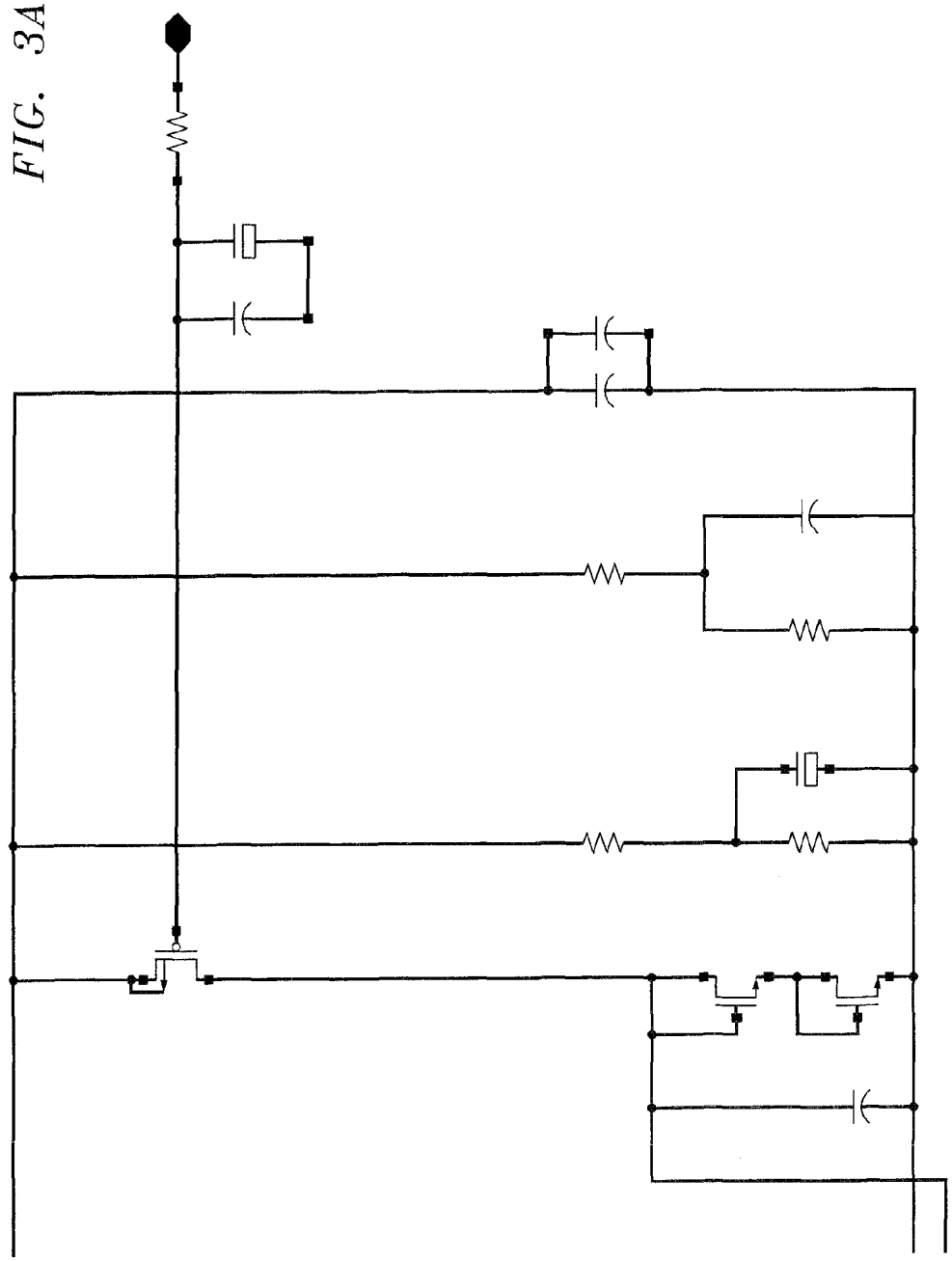
Figure 3B:
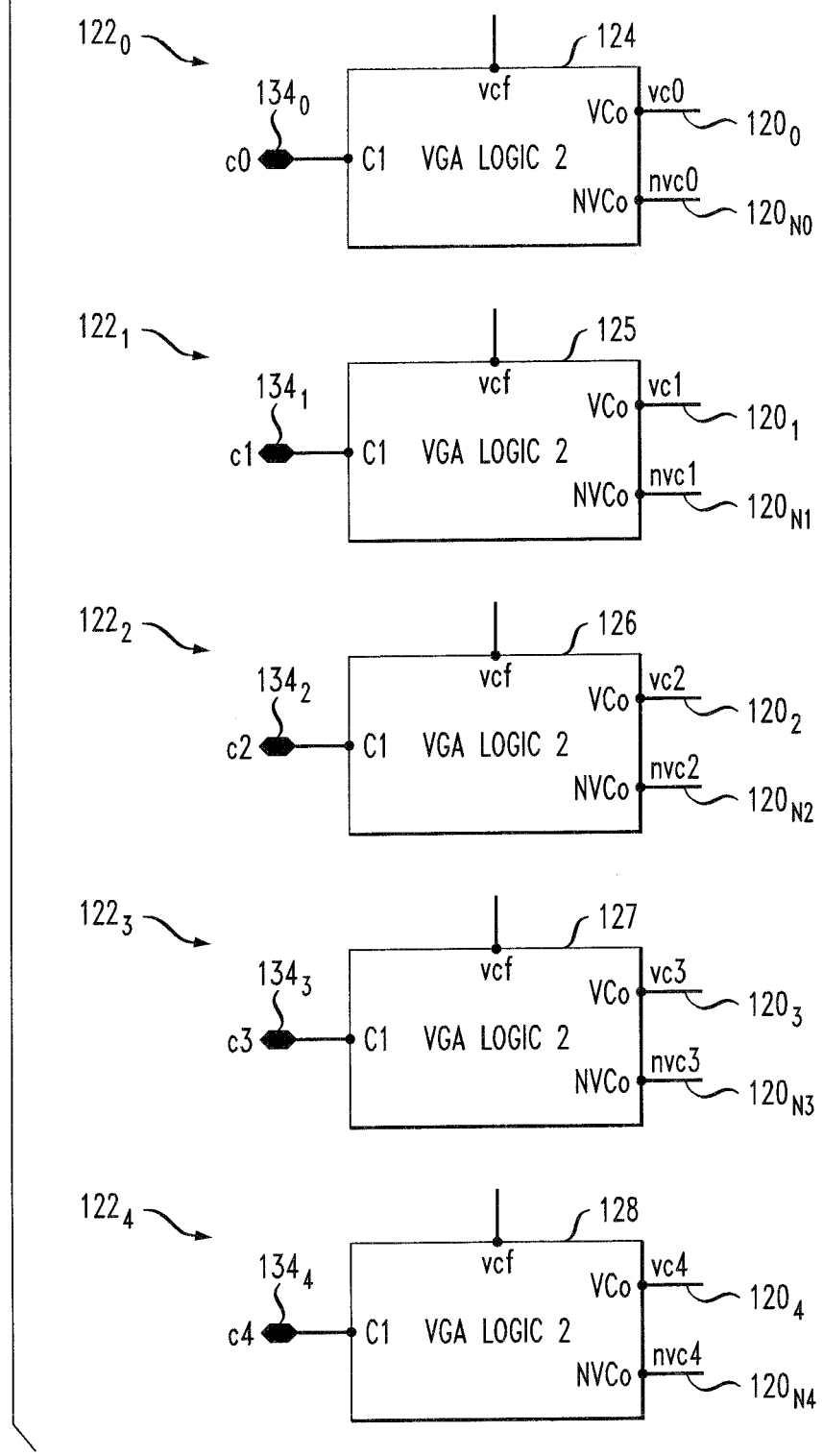
FIG. 3B illustrates another example of control circuitry for controlling the wideband variable gain amplifier illustrated in FIG. 3A.

As described above, the sensitivity of the gain may be increased by increasing the number of bits in the control word used to control the VGA as well as the number of differential MOSFET pairs 116. FIG. 3A illustrates another example of a multibit VGA 100B including five sets of differential MOSFET pairs 116. Like elements of VGA 100B have the same reference numerals as the elements of VGA 100A, and detailed descriptions are not provided. FIG. 3B illustrates one example of control circuitry 122 for controlling the differential MOSFET pairs 116 of VGA 100B.

Figure 4:
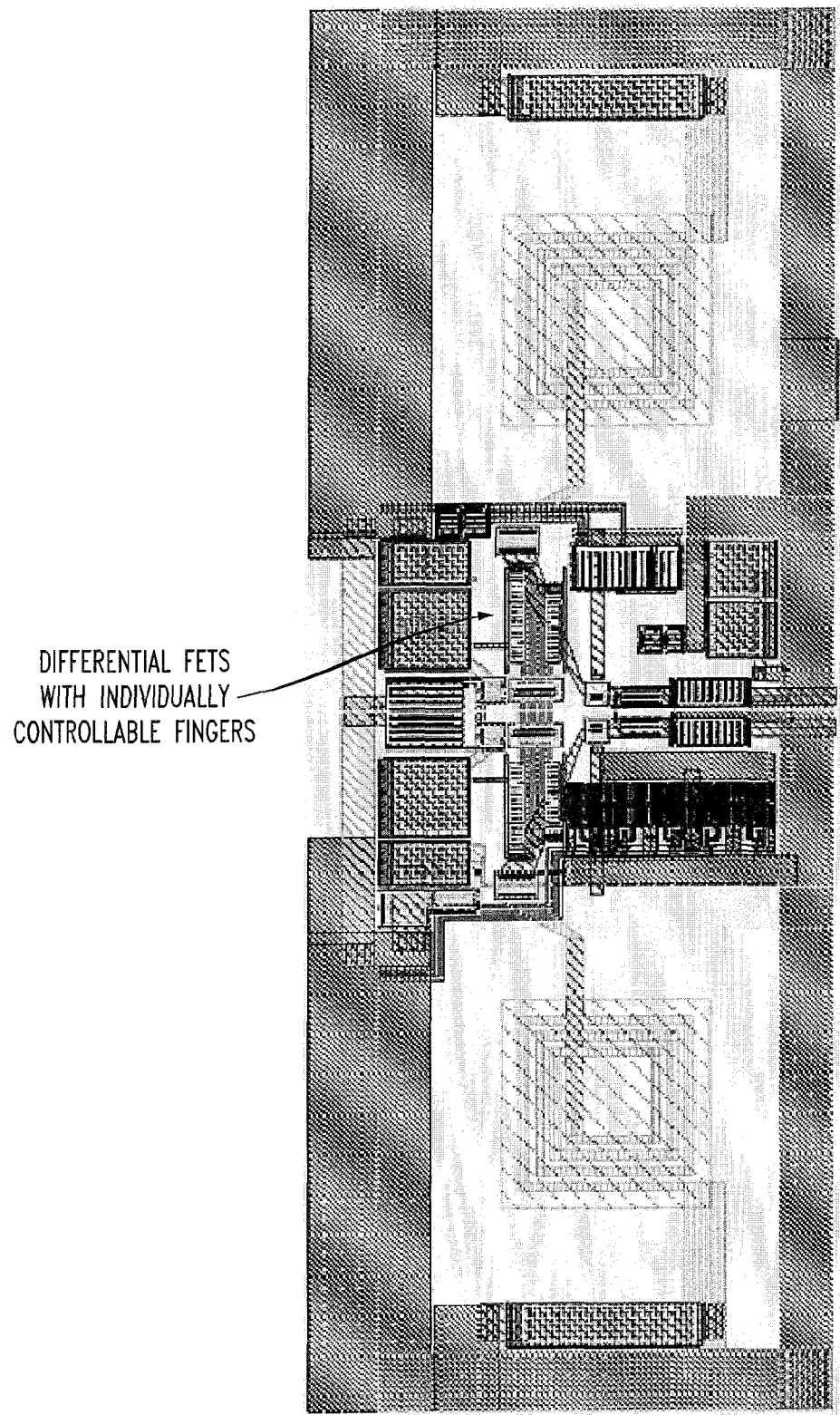
FIG. 4 illustrates one example of a layout of a VGA in accordance with the disclosure.

FIG. 4 illustrates one example of a layout of a VGA in accordance with the disclosure. As shown in FIG. 4, the individually controllable differential MOSFET pairs (fingers) may be disposed in close relationship with one another thereby providing a compact VGA having a plurality of different gains with each different gain having limited phase difference between each of the gains.

Figure 5:
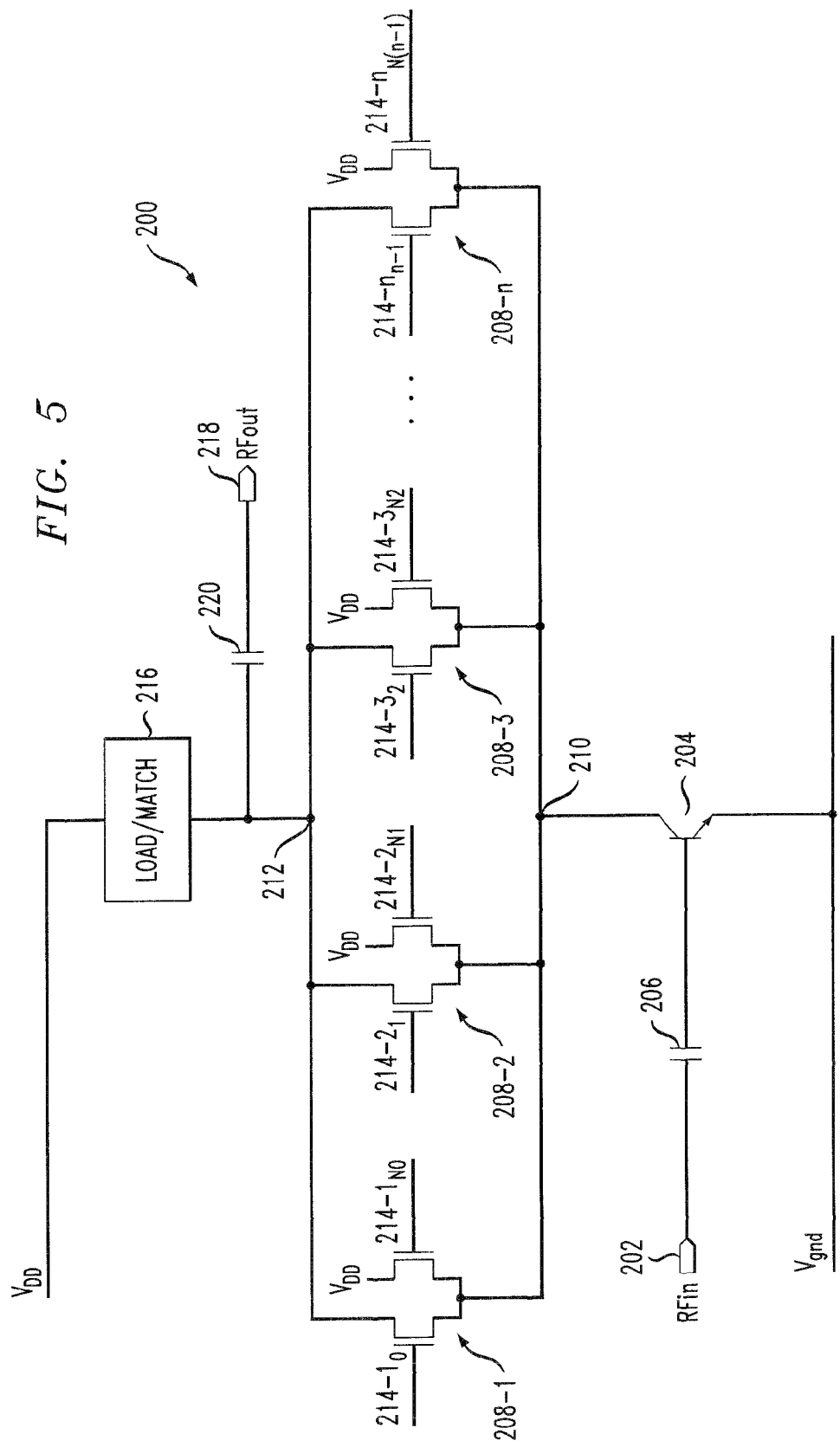
FIG. 5 illustrates a wideband variable gain amplifier implemented in a single ended configuration.

The improved wideband VGA may be implemented in a single-ended configuration as will be understood by one skilled in the art. FIG. 5 illustrates an example of a single-ended configuration of a wideband VGA 200. As shown in FIG. 5, single-ended VGA 200 includes an input node 202 configured to receive an RF input signal. Input node 202 is coupled to a base of input transistor 204 through a capacitor 206 configured to block any DC bias voltage as will be understood by one skilled in the art. In some embodiments, capacitor 206 may be coupled in parallel with a resistor to form an RC network or other circuits elements may be implemented to block the DC bias. Although input transistor 204 is illustrated as a BJT, one skilled in the art will understand that input transistor 204 may be implemented as a MOSFET or FET.

The emitter of input transistor 204 is coupled to ground, and the collector of input transistor 104 is coupled to one or more pairs of MOSFET 208-1, 208-2 (collectively referred to as "MOSFET pairs 208") coupled in parallel with each other between nodes 210 and 212. Each MOSFET pair 208 includes a pair of MOSFETs having their respective sources coupled together and their respective gates coupled to a respective control node $214$-$1_0$, $214$-$2_0$, $214$-$1_1$, $214$-$1_{N1}$, . . . , $214$-$n_{n-1}$, $214$-$n_{N(n-1)}$ where nodes $214$-$1_{N0}$, . . . , $214$-$n_{N(n-1)}$ receive the inverse signal of the signals received at control nodes $214$-$1_0$, $214$-$n_{n-1}$. The drain of one MOSFET is coupled to supply voltage $V_{DD}$ or other bias voltage as will be understood by one skilled in the art. The drain of the other MOSFET voltage is coupled to node 212 as described below. Control circuitry (not shown) may be used to control the status (i.e., opening and closing) of MOSFET pairs 208 based on a bit of a control word. Node 212 is coupled to supply voltage, $V_{DD}$, through a load matching circuitry 216. An output node 218 is coupled to node 212 through a capacitor 220.

The disclosed circuit and method advantageously enable the gain of a variable gain amplifier to be adjusted with minimal phase change between different gain settings over a wide bandwidth. Additionally, the improved variable gain amplifier disclosed herein may be implemented in a compact area such that the circuit may be implemented in a wide variety of integrated circuits.

Although the circuit and method have been described in terms of exemplary embodiments, they are not limited thereto. Rather, the appended claims should be construed broadly, to include other variants and embodiments of the disclosed circuit and method, which may be made by those skilled in the art without departing from the scope and range of equivalents.

What is claimed is:
1. A variable gain amplifier, comprising:
    a first input transistor having a base for receiving a first radio frequency (RF) input signal;

a second input transistor having a base for receiving a differential RF signal;
a first plurality of differential transistor pairs, said first plurality of differential transistor pairs connected in parallel to a first biasing transistor, the first biasing transistor configured to receive a bias voltage at its gate to keep the first biasing transistor in a conducting state;
a second plurality of differential transistor pairs, said second plurality of differential transistor pairs connected in parallel to a second biasing transistor, the second biasing transistor configured to receive a bias voltage at its gate to keep the second biasing transistor in a conducting state;
a first output transistor having its gate connected to the drain of one transistor in each differential transistor pair of the first plurality of differential transistor pairs and the drain of the first biasing transistor, and the first output transistor having its drain connected to an output terminal for delivering an output based on the first RF signal; and
a second output transistor having its gate connected to the drain of one transistor in each differential transistor pair of the second plurality of differential transistor pairs and the drain of the second biasing transistor, and the second output transistor having its drain connected to an output terminal for delivering an output based on the differential RF signal;
wherein the first and second pluralities of differential transistor pairs are configured in a cascade configuration as a single device having individually controllable fingers to provide a wideband gain control of the variable gain amplifier.

2. The variable gain amplifier of claim 1, further comprising:
a first RC network coupled to the base of the first input transistor; and
a second RC network coupled to the base of the second input transistor, the first and second RC networks for blocking a DC bias voltages.

3. The variable gain amplifier of claim 1, wherein the emitters of the first input transistor and the second input transistor are coupled to ground via a drain of a transistor having a source coupled to ground.

4. The variable gain amplifier of claim 1, further comprising a control circuit coupled to each of said differential transistor pairs, said control circuit operative to generate a control word for selectively turning on and off transistors in each of said differential transistor pairs, to thereby control the gain of said variable gain amplifier.

5. The variable gain amplifier of claim 4, wherein the control word comprises multiple bits, and wherein the control circuit applies to a transistor of each differential transistor pair a certain bit in the bit order of the control word.

6. The variable gain amplifier of claim 4, wherein each of the differential transistor pairs has the same size.

7. A method of adjusting a gain of a variable gain amplifier, comprising:
receiving a first radio frequency (RE) signal at a base of a first input transistor having a collector coupled to a first at least one differential transistor pair and to a first biasing transistor coupled in parallel with the first at least one differential transistor pair;
arranging the first at least one differential transistor pair in a cascade configuration as a single device having individually controllable fingers to provide a wideband method of gain control;
receiving a control signal at a gate of each of the transistors of the first at least one differential transistor pair to adjust the gain of the variable gain amplifier; and
outputting a first output RF signal from a node coupled to an emitter of a first output transistor having a base coupled to the first biasing transistor and to at least one of the transistors of each of the first at least one differential transistor pair.

8. The method of claim 7, further comprising:
receiving a second differential RF signal at a base of a second input transistor having a collector coupled to a second at least one differential transistor pair and to a second biasing transistor coupled in parallel with the second at least one differential transistor pair;
arranging the second at least one differential transistor pair in a cascade configuration as a single device having individually controllable fingers to provide a wideband method of gain control;
receiving a control signal at a gate of each of the transistors of the second at least one differential transistor pair to adjust the gain of the variable gain amplifier; and
outputting a second output RF signal from a node coupled to an emitter of a second output transistor having a base coupled to the second biasing transistor and to at least one of the transistors of each of the second at least one differential transistor pair.

9. The method of claim 8, further comprising blocking a DC bias voltage of the first RF signal at a first RC network coupled to the base of the first input transistor.

10. A variable gain amplifier, comprising:
a first input transistor having a base configured to receive a first radio frequency (RF) signal;
a second input transistor having a base configured to receive a differential RF signal;
a first plurality of differential transistor pairs, each differential transistor pair of said first plurality of differential transistor pairs having a common source coupled to a collector of the first input transistor; wherein each differential transistor pair in said first plurality has one transistor whose drain is coupled with the drain of another transistor of said first plurality, the common drains of corresponding transistors of the first plurality defining an output node for an output RF signal corresponding to said first RF signal;
a second plurality of differential transistor pairs, each differential transistor pair of said second plurality of differential transistor pairs having a common source coupled to a collector of the second input transistor; wherein each differential transistor pair in said second plurality has one transistor whose drain is coupled with the drain of another transistor of said second plurality, the common drains of corresponding transistors of the second plurality defining a second output node for an output RF signal corresponding to said differential RF signal,
wherein said first and second pluralities of differential transistor pairs are arranged in parallel; and
wherein a control circuit applies control signals to the gates of each transistor in each of said first and second pluralities of differential transistor pairs for selectively adjusting a voltage gain at the output nodes of the variable gain amplifier and the first and second pluralities of differential transistor pairs are configured in a cascode configuration as a single device having individually controllable fingers to provide a wideband pain control of the variable pain amplifier.

11. The variable gain amplifier of claim 10, further comprising:
a first conducting transistor whose source is coupled to the collector of the first transistor, and whose drain is coupled to the common drains of corresponding ones of the transistors of the first plurality;
a second conducting transistor whose source is coupled to the collector of the second transistor, and whose drain is coupled to the common drains of corresponding ones of the transistors of the second plurality.

12. The variable gain amplifier of claim 11, wherein:
each differential transistor pair in said first plurality has another transistor whose drain is coupled to a supply voltage.

13. The variable gain amplifier of claim 10, wherein said first and second transistors are bipolar junction transistors.

14. The variable gain amplifier of claim 13, wherein said first and second pluralities of differential transistor pairs are MOSFETs.

15. The variable gain amplifier of claim 14, wherein said first and second conducting transistors are MOSFETs.

16. A variable gain amplifier, comprising:
a first transistor having a base for receiving a radio frequency (RF) input signal;
a first differential transistor pair coupled in parallel to a second transistor, the first differential transistor pair and the second transistor coupled to a collector of the first transistor and to an output node of the variable gain amplifier;
a third transistor having a base coupled to a drain of the second transistor and to at least one transistor of the first differential transistor pair;
a fourth transistor having a base for receiving the RF input signal and an emitter coupled to an emitter of the first transistor;
a second differential transistor pair coupled in parallel to a fifth transistor, the second differential transistor pair and the fifth transistor coupled to a collector of the fourth transistor;
a sixth transistor having a base coupled to a drain of the fifth transistor and to at least one transistor of the second differential transistor pair;
a third differential transistor pair coupled in parallel to the first differential transistor pair and to the second transistor;
a fourth differential transistor pair coupled in parallel to the second differential transistor pair and to the fifth transistor;
a control circuit coupled to each of the differential transistor pairs, said control circuit operative to generate a control word for selectively turning on and off transistors in each of said differential transistor pairs, to thereby control the gain of the variable gain amplifier;
wherein each transistor of each differential transistor pair is configured to receive a control signal from said control circuit at its respective gate for adjusting a gain of the variable gain amplifier; and
wherein each of the differential transistor pairs has the same size.

\* \* \* \* \*

UNITED STATES PATENT AND TRADEMARK OFFICE
CERTIFICATE OF CORRECTION

PATENT NO. : 8,576,006 B1  
APPLICATION NO. : 13/306674  
DATED : November 5, 2013  
INVENTOR(S) : Brandon R. Davis Page 1 of 1

It is certified that error appears in the above-identified patent and that said Letters Patent is hereby corrected as shown below:

In the Claims:

Column 7, line 30, claim 1, seventh word should read "cascode".
Column 8, line 66, claim 10, seventh word should read "gain".
Column 8, line 67, claim 10, third word should read "gain".

Signed and Sealed this
Thirty-first Day of December, 2013

Margaret A. Focarino
*Commissioner for Patents of the United States Patent and Trademark Office*